US008685774B2

(12) United States Patent
Crowder et al.

(10) Patent No.: US 8,685,774 B2
(45) Date of Patent: Apr. 1, 2014

(54) METHOD FOR FABRICATING THREE-DIMENSIONAL GALLIUM NITRIDE STRUCTURES WITH PLANAR SURFACES

(75) Inventors: Mark Albert Crowder, Portland, OR (US); Changqing Zhan, Vancouver, WA (US); Paul J. Schuele, Washougal, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 13 days.

(21) Appl. No.: 13/337,843

(22) Filed: Dec. 27, 2011

(65) Prior Publication Data

US 2013/0161643 A1 Jun. 27, 2013

(51) Int. Cl.
*H01L 21/00* (2006.01)
(52) U.S. Cl.
USPC ...... 438/46; 435/481; 435/689; 257/E29.005; 257/E29.089
(58) Field of Classification Search
USPC .................. 438/481, 689; 257/77, 507, 615
See application file for complete search history.

(56) References Cited

U.S. PATENT DOCUMENTS

| 2003/0207125 | A1* | 11/2003 | Sunakawa et al. ............ 428/428 |
| 2006/0273328 | A1 | 12/2006 | Niu et al. .......................... 257/79 |
| 2007/0087460 | A1* | 4/2007 | Sakong et al. ..................... 438/22 |
| 2009/0065795 | A1 | 3/2009 | Chan et al. ........................ 257/99 |
| 2010/0006894 | A1* | 1/2010 | Ohta et al. ....................... 257/192 |
| 2010/0072501 | A1* | 3/2010 | Wakai et al. ...................... 257/98 |
| 2010/0120228 | A1* | 5/2010 | Saito et al. ...................... 438/463 |
| 2011/0284380 | A1 | 11/2011 | Martin et al. ................... 204/622 |
| 2012/0142142 | A1* | 6/2012 | Chang et al. ................... 438/104 |

FOREIGN PATENT DOCUMENTS

| JP | 2004363346 | * | 12/2004 |
| JP | 2007-67182 | * | 3/2007 |
| JP | 2007067182 | A | 3/2007 |
| JP | 2011-119612 | | 12/2009 |

OTHER PUBLICATIONS

Kim and Jung, "Emission enhancement from nonpolar a-plane III-nitride nanopillar", Jour. of Vacuum Science and Technology, vol. 29, pp. 021004-1 to 021004-4, Jan. 24, 2011.
Nguyen, X.L., Nguyen, T.N.N., Chau, V.T. & Deng, M.C. The fabrication of GaN-based light emitting diodes (LEDs). Adv. Nat. Sci: Nanosci. Nanotechnol. 1, 025015 (2010).
Fujii, T. et al. Increase in the extraction efficiency of GaN-based light-emitting diodes via surface roughening. Applied Physics Letters 84, 855 (2004).

(Continued)

*Primary Examiner* — A. Sefer
(74) *Attorney, Agent, or Firm* — Law Office of Gerald Maliszewski; Gerald Maliszewski

(57) ABSTRACT

A method is provided for fabricating three-dimensional gallium nitride (GaN) pillar structures with planar surfaces. After providing a substrate, the method grows a GaN film overlying a top surface of the substrate and forms cavities in a top surface of the GaN film. The cavities are formed using a laser ablation, ion implantation, sand blasting, or dry etching process. The cavities in the GaN film top surface are then wet etched, forming planar sidewalls extending into the GaN film. More explicitly, the cavities are formed into a c-plane GaN film top surface, and the planar sidewalls are formed perpendicular to a c-plane, in the m-plane or a-plane family.

20 Claims, 16 Drawing Sheets

(56) References Cited

OTHER PUBLICATIONS

Lee, H.C. et al. Effect of the surface texturing shapes fabricated using dry etching on the extraction efficiency of vertical light-emitting diodes. Solid-State Electronics 52 (2008).
Kang, J.-W. et al. Improved Light Extraction of GaN-Based Green Light-Emitting Diodes with an Antireflection Layer of ZnO Nanorod Arrays. Electrochem, Solid-State Lett. 14, H1 (2001).
"Crystallographic wet chemical etching of GaN" APL v. 73. n. 18, 1998, p. 2655.
D. Zhuang and J.H. Edgar Materials Science and Engineering R 48 (2005) 1-46.
D. Li, M. Sumiya, K. Yoshimura, Y. Suzuki, Y. Fukuda, S. Fuke, Phys. Status Solidi A 180 (2000) 357.
Seok-In Na et al, IEEE Photonics Technology Letters, vol. 18, No. 14, Jul. 15, 2006.
S.D. Hersee, et al., The controlled growth of GaN nanowires. Nano Letters 6, 1808 (2006).

* cited by examiner

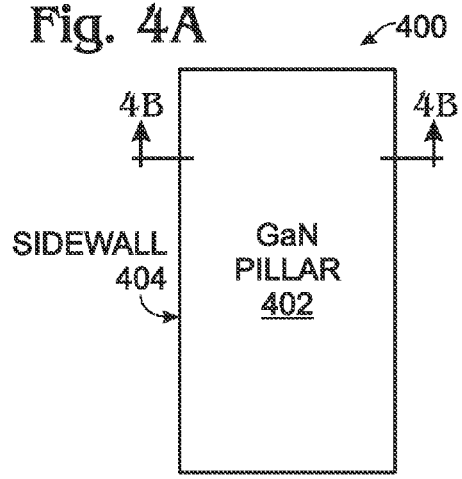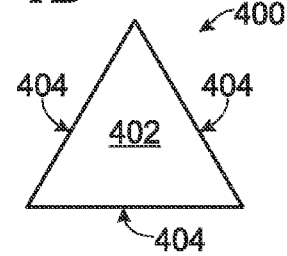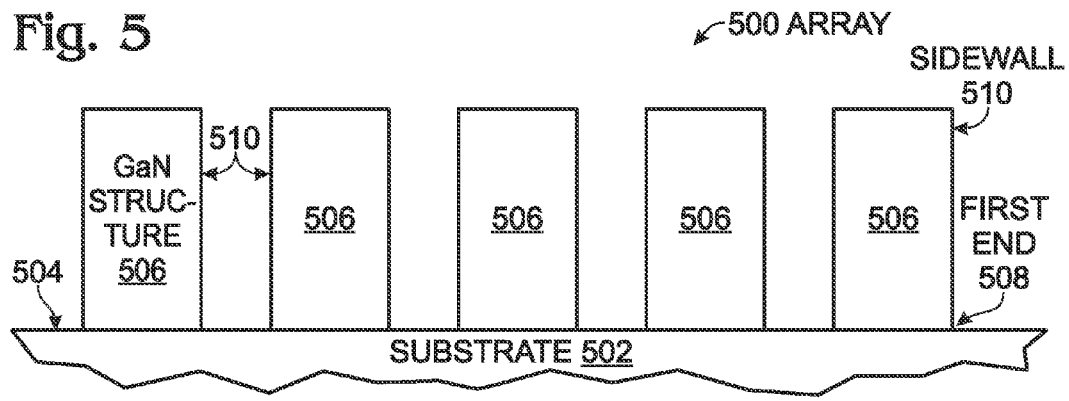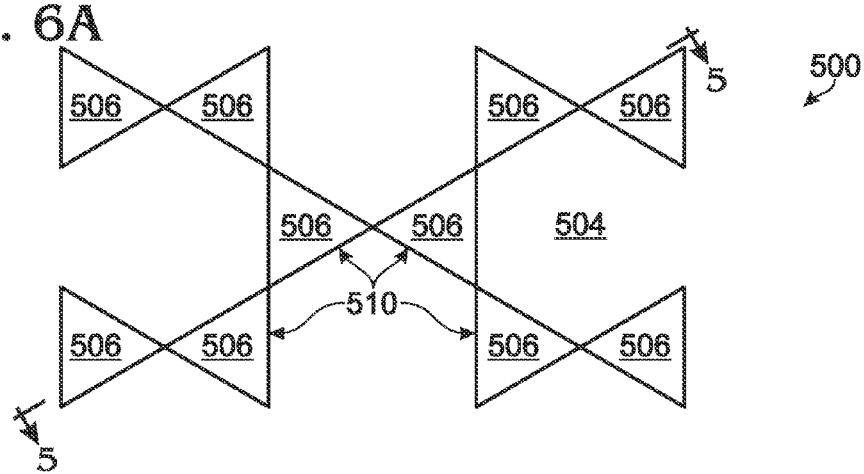

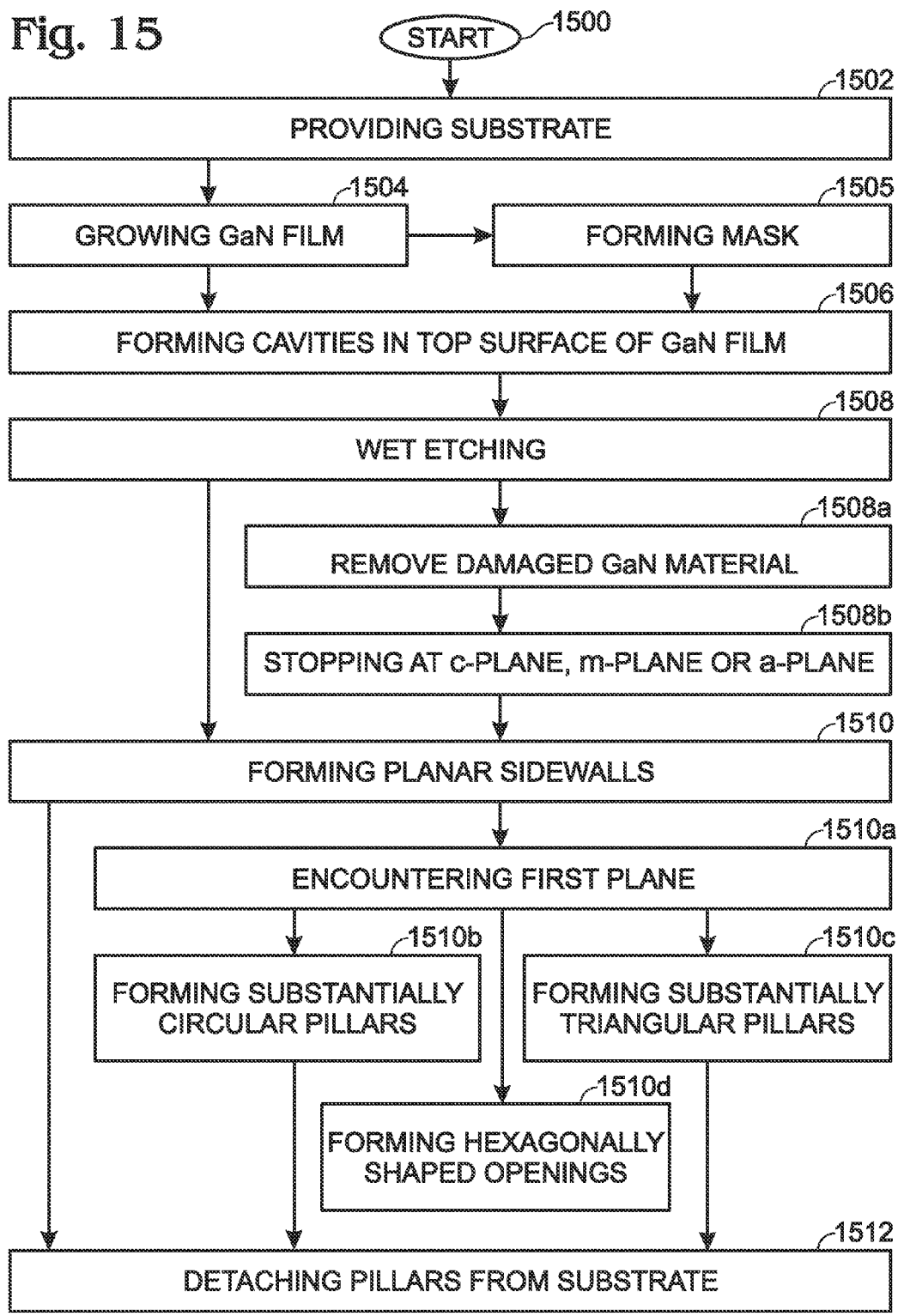

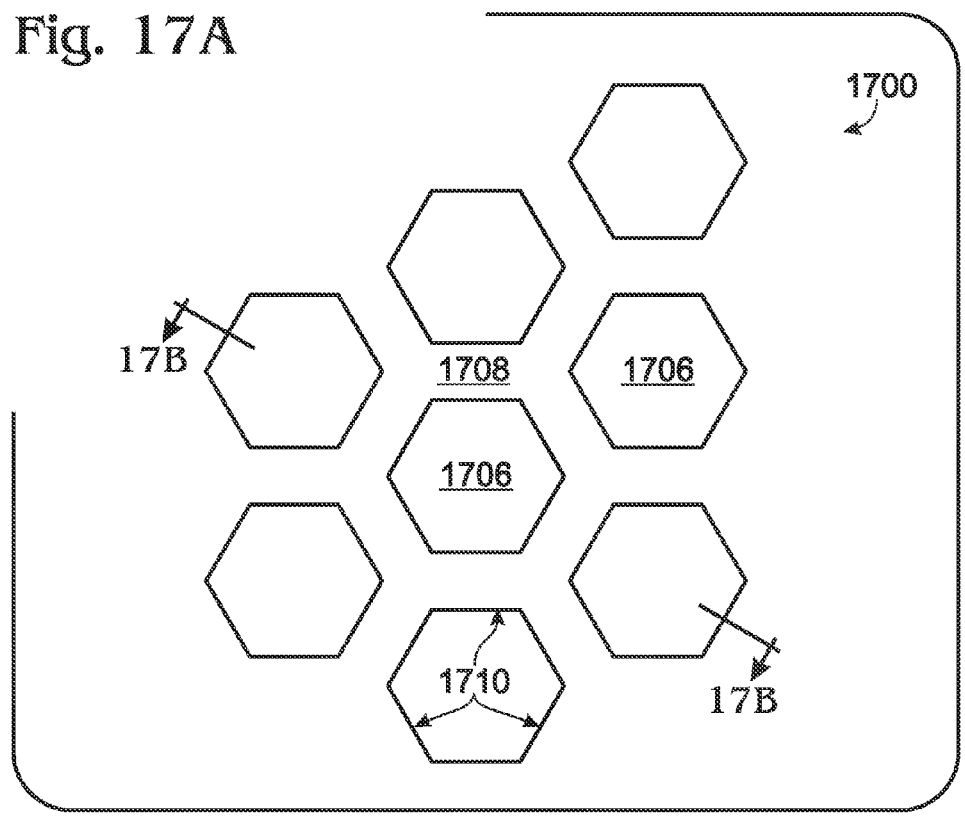
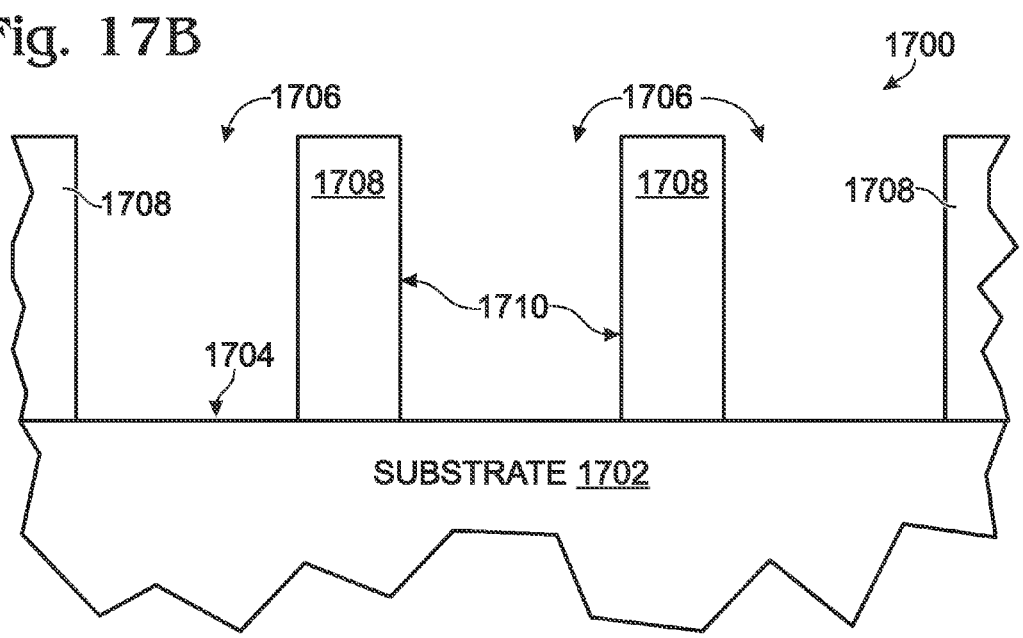

US 8,685,774 B2

METHOD FOR FABRICATING THREE-DIMENSIONAL GALLIUM NITRIDE STRUCTURES WITH PLANAR SURFACES

BACKGROUND OF THE INVENTION

1. Field of the Invention

This invention generally relates to light emitting diode (LED) fabrication processes and, more particularly, to a method for fabricating three-dimensional (3D) gallium nitride structures with planar surfaces.

2. Description of the Related Art

FIG. 1 is a partial cross-sectional view of a planar gallium nitride LED (prior art). Gallium nitride (GaN) is widely used for LED applications due to its favorable band-gap and direct band structure, and most fabrication follows a planar metalorganic chemical vapor deposition (MOCVD) sequence, as noted by Nguyen, X. L., Nguyen, T. N. N., Chau, V. T. & Dang, M. C., "The fabrication of GaN-based light emitting diodes (LEDs)", Adv. Nat. Sci: Nanosci. Nanotechnol. 1, 025015 (2010), as follows:

1) A thick n-GaN with Si doping is deposited on a sapphire substrate;

2) A multiple quantum well (MQW) layer is formed consisting of alternating thin layers of InGaN and AlGaN; and, 3) A thin p-GaN layer is formed with Mg doping.

One of the constraints on this technology is the high cost of producing GaN for devices due to the difficulties encountered in forming a sufficient high-quality material. These difficulties primarily stem from the growth process, which is typically conducted at very high temperatures (e.g., over 1,000° C.) in molecular beam epitaxy (MBE) or MOCVD reactors and on substrates with a different coefficient of thermal expansion (CTE). The difference in CTE can lead to formation of threading dislocations that adversely affect device performance and reliability. In addition, film stress limits the amount of dopants that can be incorporated in a GaN film, which in turn limits the range of emission characteristics that are achievable. So it would be desirable to improve the defect density and increase the amount of device surface area that can produce LED emission for a given area of growth substrate.

FIGS. 2A through 2C are partial cross-sectional views of LED devices with textured surfaces (prior art). FIG. 2A depicts a planar LED, FIG. 2B depicts a flip chip LED, and FIG. 2C depicts a textured template LED. One other consideration of the planar LED structure is the high index of refraction of GaN, which limits the amount of light that can be emitted to a narrow angular cone. Light outside the escape cone is reflected internally, diminishing the efficiency of the device. A variety of ways have been devised to enhance the roughness of the encapsulation layer on planar devices as a means to allow more light to escape, see Fujii, T. et al., "Increase in the extraction efficiency of GaN-based light-emitting diodes via surface roughening", Applied Physics Letters 84, 855 (2004), and the dry etch texturing study of Lee, H. C. et al., "Effect of the surface texturing shapes fabricated using dry etching on the extraction efficiency of vertical light-emitting diodes", Solid-State Electronics 52, 1193-1196 (2008). Nanostructured surface coatings have also been used in a similar way to extract internal reflections (Kang, J. W. et al., "Improved Light Extraction of GaN-Based Green Light-Emitting Diodes with an Antireflection Layer of ZnO Nanorod Arrays", Electrochem. Solid-State Lett. 14, H120-H123 (2011).

FIGS. 3A and 3B depict, respectively, a GaN micro-rod LED structure and a device fabricated from an array of micro-rod LEDs (prior art). One method to alleviate the problems with planar device fabrication is to use GaN nanowires or micro-rods (μ-rods). Such structures can be fabricated at high temperature with the appropriate shell structures to form a p-QW-n LED, harvested from the growth substrate, and deposited using a dielectrophoresis (i.e., e-field) process. GaN μ-rods provide a non-planar template, often in the form of a hexagonal or triangular rod, for the epitaxial growth of quantum well (QW) structures. The divergence from planar should provide a higher efficiency for light extraction. The diameter of the μ-rods and nanowires is typically small enough that the threading dislocation density is significantly reduced, increasing the internal quantum efficiency (IQE) and lifetime. By controlling the crystallographic orientation of the GaN μ-rods, non-polar or semi-polar planes can be used for device fabrication, thereby reducing the effect of the quantum confined stark effect (QCSE), which, in turn, can also lead to improvements in the IQE.

Several research groups have worked on development of GaN nanowires to varying degrees of success. One approach that yields high-quality GaN nanowires was developed by UNM researchers, and uses MOCVD epitaxial growth from a templated substrate (S. D. Hersee, et al., "The controlled growth of GaN nanowires", Nano Letters 6, 1808 (2006). This process yielded good nanowires with a constant diameter and a hexagonal cross-section with sidewall orientations in the (1100) family. However, the growth was limited to 2 μm per hour.

Other VLS-based growth processes have been developed using various catalysts (e.g., Ge, Au, or Fe), with resulting nanowires and nanorods being produced and fabricated into LED devices. The crystallographic orientation of VLS-grown GaN nanowires can be non-ideal, as there are competing preferred axial orientations for growth (a- and c-axis, depending on temperature), competing phases (zinc-blend and wurtzite), and the resulting nanowires can have non-uniform sidewall orientations. This can affect the uniformity of e-field dispersed GaN nanowires that are used for device fabrication.

It would be advantageous if a GaN LED could be fabricated with uniform sidewall orientations and a minimal density of defects.

SUMMARY OF THE INVENTION

Disclosed herein is a class of structures for gallium nitride (GaN) based light emitting diodes (LEDs) that have improved performance because of the 3-dimensional shape of the initial GaN template over which the LED layers are deposited. The template shape can be columnar, which forms micro-rod or pillar LEDs, and can be connected in an array to make high efficiency lighting of arbitrary size and shape. Alternatively, the template can have a series of pits that increase the emission area and improve light extraction for a planar device. Template shapes are formed by a combination of a damage etch and a wet etch that selectively removes damaged GaN, leaving high quality low etch rate crystalline planes. LED devices made from these template shapes are unlike conventional technologies that fabricate LED structures by MOCVD deposition on planar n-type GaN substrates, creating large planar devices. Further, unlike conventional devices, LED devices made from the above-mentioned templates do not require addition top surface texturing after the LED device is formed.

Accordingly, a method is provided for fabricating three-dimensional GaN pillar structures with planar surfaces. After providing a substrate, the method grows a GaN film overlying a top surface of the substrate and forms cavities in a top surface of the GaN film. The cavities are formed using a laser ablation, ion implantation, sand blasting, or dry etching process. The cavities in the GaN film top surface are then wet etched, forming planar sidewalls extending into the GaN film. More explicitly, the cavities are formed into a c-plane GaN film top surface, and the planar sidewalls are formed perpendicular to a c-plane, in the m-plane or a-plane family.

A GaN three-dimensional (3D) structure is also provided made from a GaN pillar, with pillar sidewalls formed in the m-plane or a-plane. Typically, the GaN pillar has a triangular or hexagonal pattern. In another aspect, a GaN 3D array is provided with a substrate having a top surface, and an array of hexagonally shaped openings in the GaN film, forming a GaN honeycomb structure.

Additional details of the above-mentioned method and structures are provided below.

BRIEF DESCRIPTION OF THE DRAWINGS

FIGS. 4A and 4B are partial cross-sectional views of a GaN three-dimensional (3D) structure.

FIG. 5 is a partial cross-section view depicting a GaN 3D array.

FIGS. 6A and 6B are plan views of the array of FIG. 5.

FIG. 15 is a flowchart illustrating a method for fabricating three-dimensional GaN pillar structures with planar surfaces.

FIGS. 17A and 17B are, respectively, plan and partial cross-sectional views of another type of GaN 3D array.

DETAILED DESCRIPTION

Figure 1:
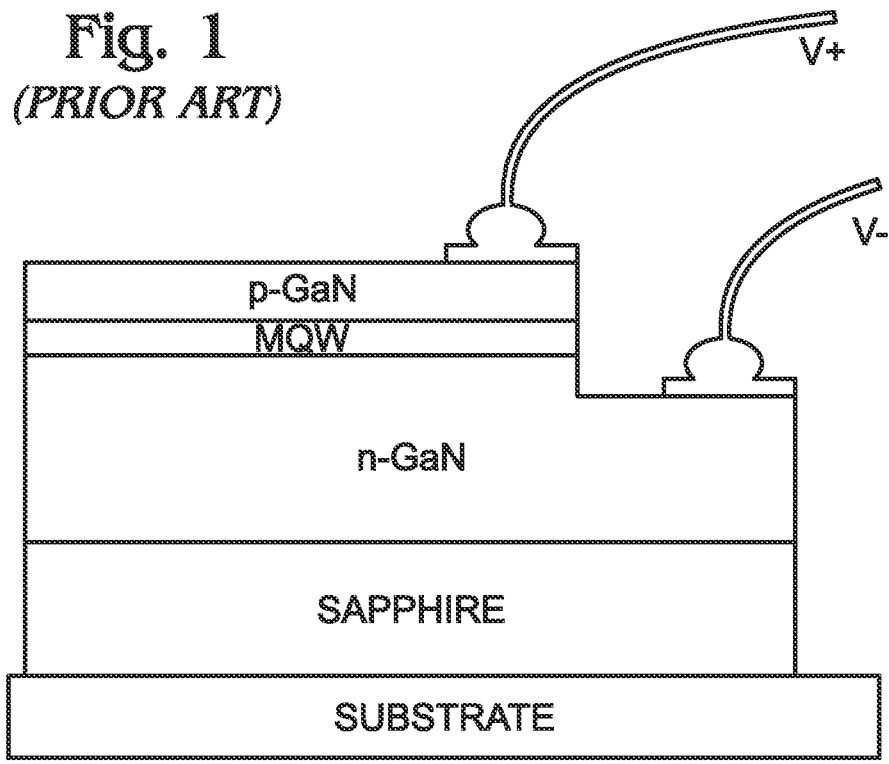
FIG. 1 is a partial cross-sectional view of a planar gallium nitride LED (prior art).
Figure 2A:
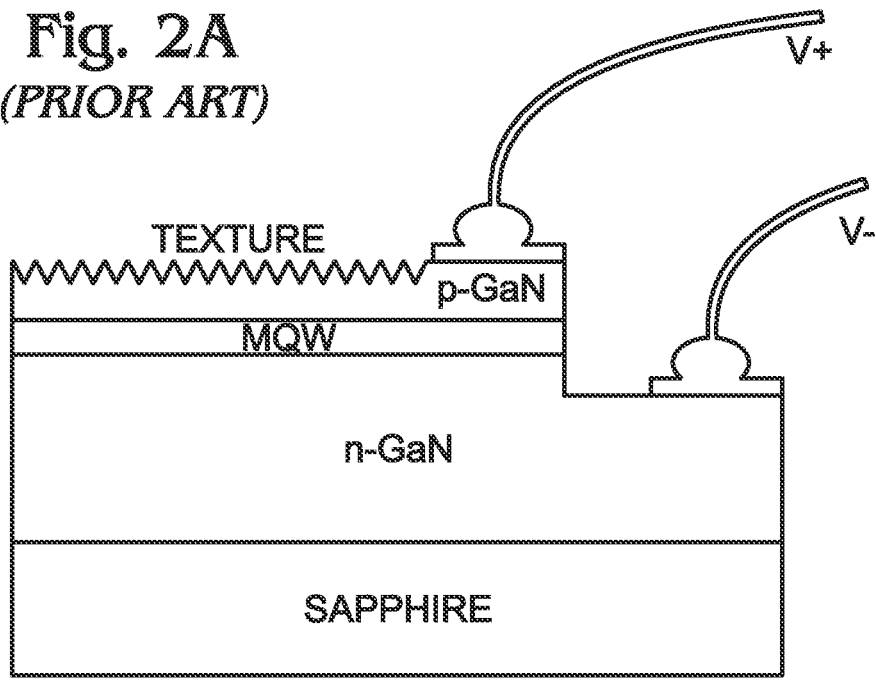
FIGS. 2A through 2C are partial cross-sectional views of LED devices with textured surfaces (prior art).
Figure 2B:
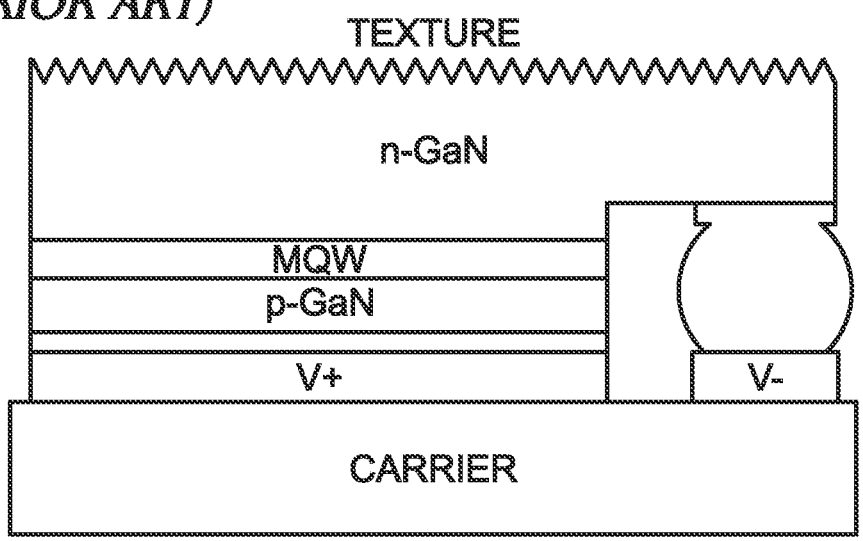
Figure 2C:
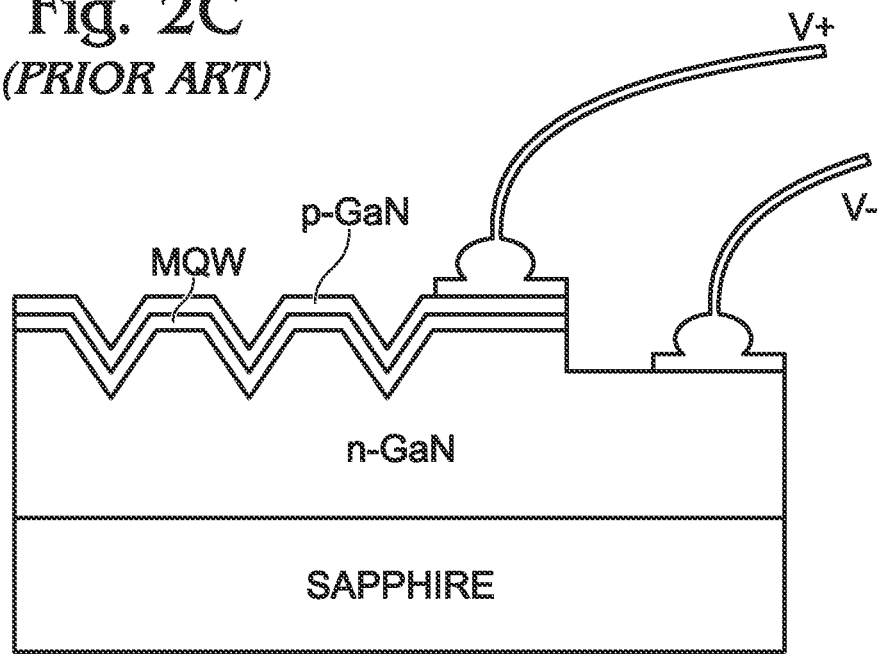
Figure 3A:
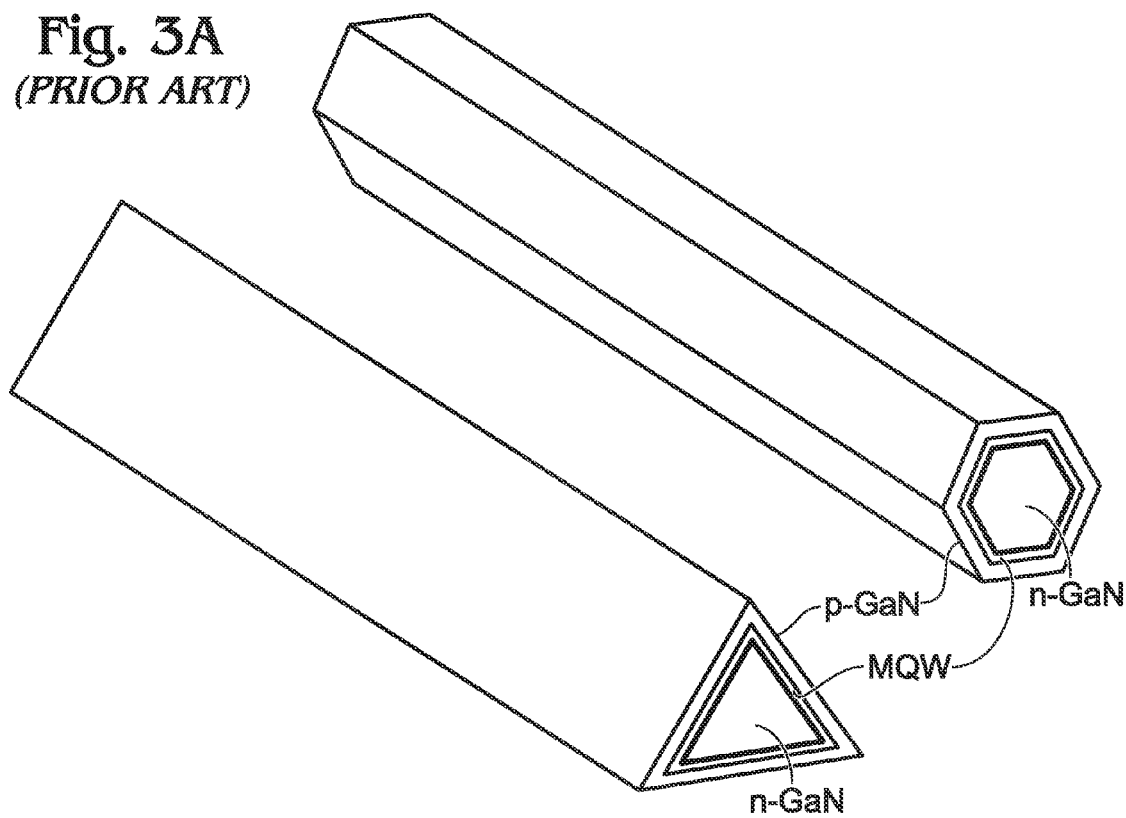
FIGS. 3A and 3B depict, respectively, a GaN micro-rod LED structure and a device fabricated from an array of micro-rod LEDs (prior art).
Figure 3B:
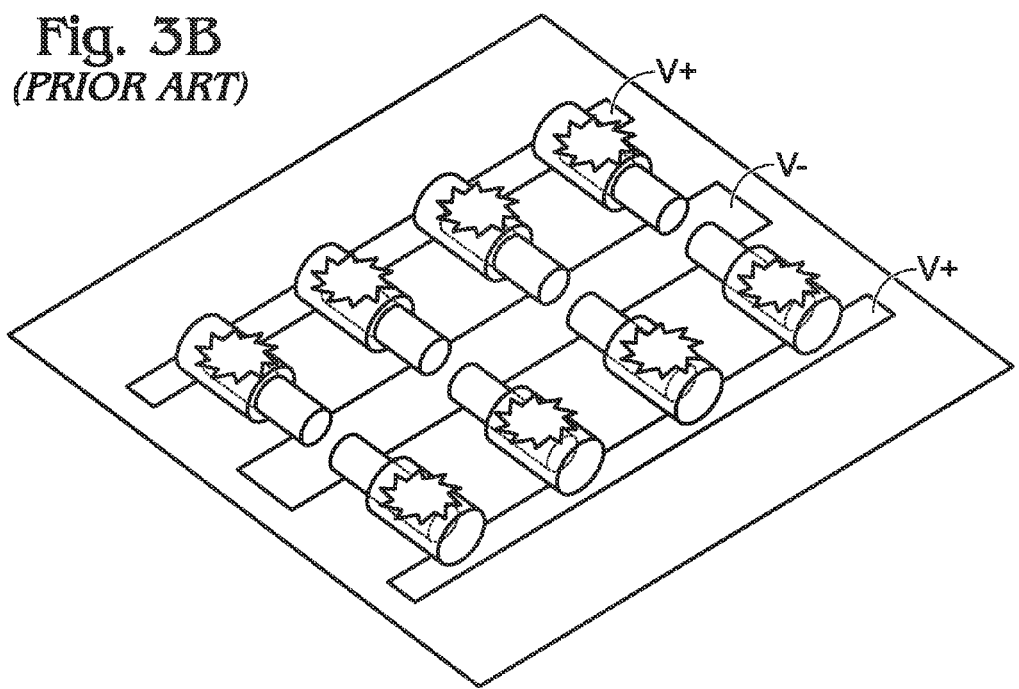

FIGS. 4A and 4B are partial cross-sectional views of a GaN three-dimensional (3D) structure. The GaN 3D structure 400 comprises a GaN pillar 402 and pillar sidewalls 404. The pillar sidewalls 404 are formed in either the m-plane (1 0 $\bar{1}$ 0) or a-plane ($\bar{1}$ 2 $\bar{1}$ 0). Each family of planes (m and a) both contain 6 faces. The 6 faces for the m-plane family are {1 0 $\bar{1}$ 0}, {$\bar{1}$ 0 1 0}, {0 1 $\bar{1}$ 0}, {0 1 $\bar{1}$ 1 0}, {1 $\bar{1}$ 00}, and {$\bar{1}$ 100}. For the a-plane family, the faces are {1 $\bar{2}$ 10}, {$\bar{1}$ 2 $\bar{1}$ 0}, {1 1 $\bar{2}$ 0}, {2 $\bar{1}$ $\bar{1}$ 0}, {$\bar{1}$ $\bar{1}$ 2 0}, and {$\bar{1}$ 1 1 0}.

Note that for these Miller indices, families are in (parentheses), faces are in {curly brackets}, and zone axes are in [square brackets]. As shown in FIG. 4B, the GaN pillar 402 typically has a triangular pattern. However, hexagonally shaped pillars may alternatively be formed, see FIG. 6B.

FIG. 5 is a partial cross-section view depicting a GaN 3D array. The array 500 comprises a substrate 502 with a top surface 504, with an array of GaN structures 506. Each GaN structure 506 has a first end 508 attached to the substrate top surface 504, and sidewalls 510 formed in the m-plane or a-plane. Typically, the substrate 502 is a material such as sapphire, silicon, or silicon carbide. However, the array 500 is not limited to any particular substrate material.

Figure 6B:
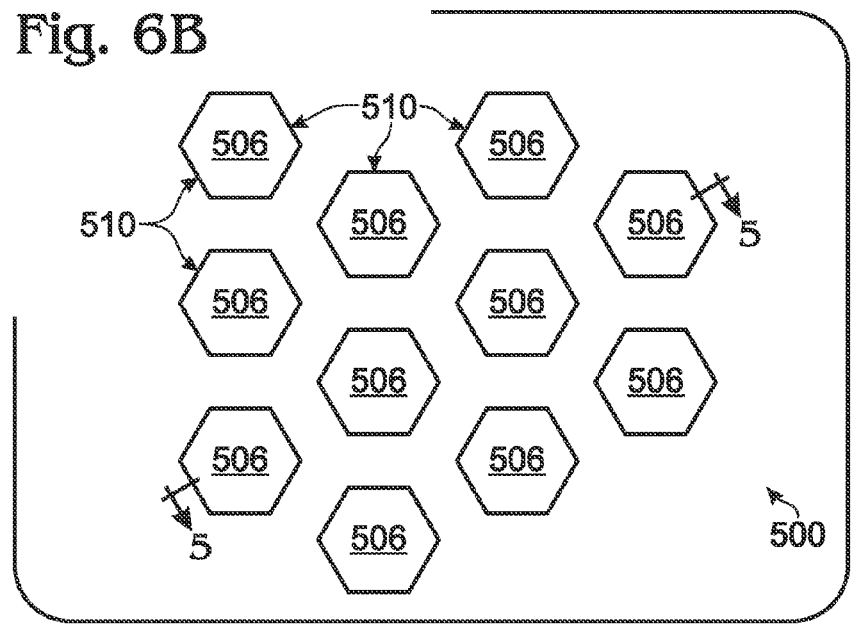

FIGS. 6A and 6B are plan views of the array of FIG. 5. The GaN structures 506 of FIG. 5 are GaN pillars. As shown in FIG. 6A, the GaN pillars or micro-rods 402 may have a triangular shape. As shown in FIG. 6B, the GaN pillars having a hexagonal shape. As shown, the hex-shaped pillars may have a hole or hollow core that extends at least partially through the pillar.

FIGS. 17A and 17B are, respectively, plan and partial cross-sectional views of another type of GaN 3D array. The array 1700 comprises a substrate 1702 with a top surface 1704. A honeycomb structure of openings 1706 are formed in a GaN film 1708. Each opening 1706 has sidewalls 1710 formed in the m-plane or a-plane. Typically, the openings 1706 formed in the GaN film 1708 have a hexagonal shape. The substrate 1702 may be sapphire, silicon, or silicon carbide.

Planar GaN films deposited on sapphire substrates can be used to form etched 3-dimensional structures such as rods or cavities that can act as a template for subsequent epitaxial growth of doped GaN layers to make LED devices with unconventional topologies. The general method of fabrication uses a technique such as plasma etch or laser ablation to form a damage region in the GaN layer, followed by a wet etch that selectively removes the damaged material. The final shape is formed by crystallographic planes of GaN that have very low etch rates and have desirable properties for device fabrication such as low density of dislocations and trap states. One aspect of the first etch step is to remove material and create a damage profile with a shape such as a micro-rod or conical cavity that is appropriate for the type of device to be made. Other techniques such as ion implant or sand blasting may also be used to form the damage region. The wet etch step refines the initial shape and produces surfaces with low damage that can make high quality devices.

One aspect forms columnar templates and deposits the layers required to make an LED over the template to make micro-rod LEDs that can be harvested, deposited on a new substrate and wired together to make an array of LED emitters.

One other consideration of the planar LED structure is the high index of refraction of GaN, which limits the amount of light that can be emitted to a narrow angular cone. Light outside the escape cone is reflected internally, diminishing the efficiency of the device. As noted above, a variety of ways have been devised to enhance the roughness of the encapsulation layer of conventional planar devices as a means to allow more light to escape. The structures disclosed herein improve light extraction by etching a surface texture, which also increases the emission area compared to conventional planar LED, in the n-type GaN starting material before LED fabrication.

To fabricate high performance of GaN based devices, GaN patterning (i.e. etching) techniques are crucial. Variations in the quality of the as-grown GaN, coupled with the high bond energies associated with "III-nitride" materials, present unique challenges for etching processes. Similar to etching other semiconductor materials, plasma based dry etch and chemical based wet etch are the two major etch techniques for GaN patterning. Laser patterning GaN film is also capable of achieving unique structures when combined with proper wet etching techniques to remove the ablated material and the thermal decomposition.

Typical etching gases for GaN plasma dry etch are $Cl_2/Ar$. Argon (or helium) is added to stabilize the plasma or for cooling purposes. Argon addition causes inert ion bombardment of the surface, which results in enhanced anisotropic etching, while the chlorine-based plasma produces (volatile) chemical byproducts such as $GaCl_3$. The dry etch process can achieve a highly anisotropic etch with a high etching rate and has a smooth surface morphology. Using $Cl_2$-based plasma to etch GaN is desirable because chlorine-based gas chemistry is widely used in the processing of semiconductor devices.

Figure 7:
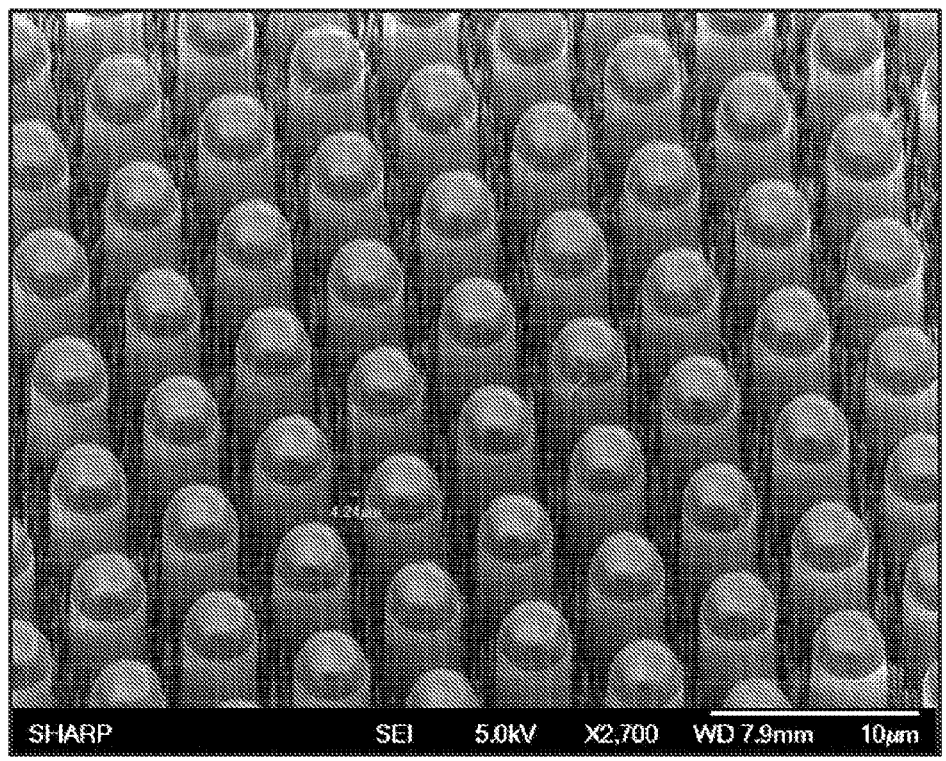
FIG. 7 is a perspective view showing a GaN micro-pillar array etched using $Cl_2$-based plasma dry etch.

FIG. 7 is a perspective view showing a GaN micro-pillar array etched using $Cl_2$-based plasma dry etch. The etch parameters may be controlled. Defects in the GaN appear to be particularly sensitive to etching conditions and respond by etching faster or slower than the surrounding material, ultimately forming pits or grass, as shown.

One facet of GaN plasma dry etching is that it is easy to generate ion-induce damages, which may degrade the GaN based devices performance. To address this issue, the dry and wet etching techniques may be combined, or laser ablation and wet etching techniques may be combined.

As mentioned above, most conventional processes deposit GaN on foreign substrates, such as sapphire or silicon carbide. Wet etching studies have previously been limited almost exclusively to the (0001) orientation, since until recently, only such epitaxial films were available. A variety of chemistries have been demonstrated as being able to attack specific planes in the GaN crystallographic system, as shown in Table 1.

TABLE I

Etch rates and observed etching planes for various chemicals.

| Chemical | Temperature (° C.) | Etch rate (μm/min) | Etching planes observed |
|---|---|---|---|
| Acetic acid ($CH_3COOH$) | 30 | <0.001 | None |
| Hydrochloric acid (HCl) | 50 | <0.001 | None |
| Nitric acid ($HNO_3$) | 81 | <0.001 | None |
| Phosphoric acid ($H_3PO_4$) | 108-195 | 0.013-3.2 | $\{10\bar{1}2\}, \{10\bar{1}3\}$ |
| Sulphuric acid ($H_2SO_4$) | 93 | <0.001 | None |
| Potassium hydroxide (KOH), molten | 150-247 | 0.003-2.3 | $\{10\bar{1}0\}, \{10\bar{1}\bar{1}\}$ |
| 50% KOH in $H_2O$ | 83 | <0.001 | None |
| 10%-50% KOH in ethylene glycol ($CH_2OHCH_2OH$) | 90-182 | 0.0015-1.3 | $\{10\bar{1}0\}$ |
| 50% NaOH in $H_2O$ | 100 | <0.001 | None |
| 20% NaOH in ethylene glycol | 178 | 0.67-1.0 | None |

GaN can be etched in an aqueous base solution, however, etching ceases upon the formation of an insoluble coating of presumably gallium hydroxide ($Ga(OH)_3$). For (0001) orientation GaN films, there are two types surfaces polarity, one is Ga-polar GaN and another is N-polar GaN. Most GaN films grown by metal organic chemical vapor deposition (MOCVD) or hydride vapor phase epitaxy (HVPE) are Ga-polar films, and GaN films grown by metal organic molecular beam epitaxy (MOMBE) are N-polar films. As noted in "Crystallographic wet chemical etching of GaN" APL v. 73. n. 18, 1998, p. 2655, in aqueous KOH, NaOH or TMAH, only nitrogen polar GaN films were etched, and produced triangular shaped pyramids limited by ($11\bar{2}1$) planes. No etching of Ga-polar films occurred in aqueous KOH, NaOH or TMAH.

The different etching characteristics of Ga-polar and N-polar crystals are due to the different states of surface bonding and are only dependent on polarities. The mechanism of such polarity selective etching was interpreted by D. Li, M. Sumiya, K. Yoshimura, Y. Suzuki, Y. Fukuda, S. Fuke, Phys. Status Solidi A 180 (2000) 357.

Figure 8:
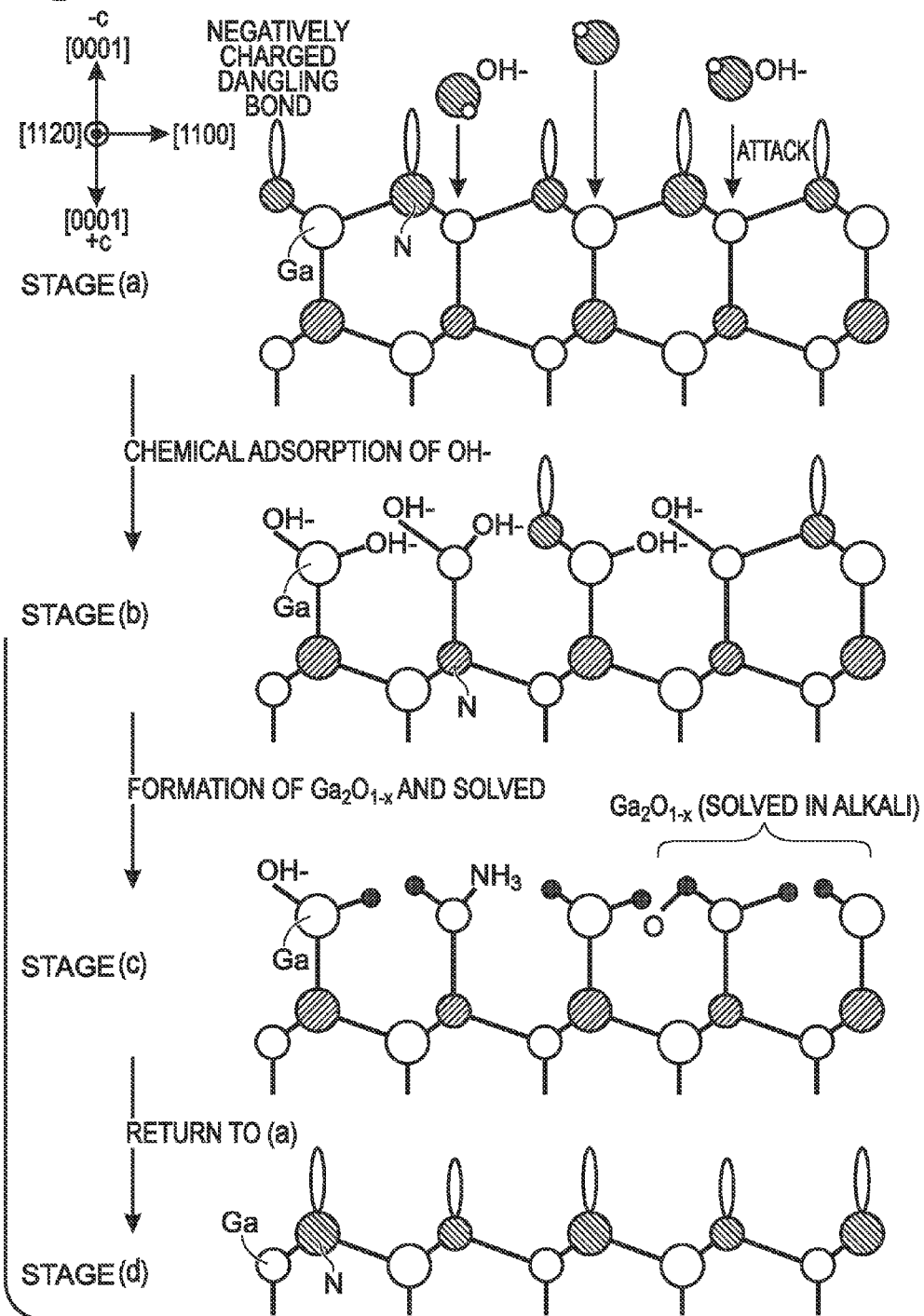
FIG. 8 depicts schematic diagrams of the cross-sectional GaN film viewed along the direction for N-polar GaN to explain the mechanism of the polarity selective etching.

FIG. 8 depicts schematic diagrams of the cross-sectional GaN film viewed along the direction for N-polar GaN to explain the mechanism of the polarity selective etching. Stage (a) shows a nitrogen terminated layer with one negatively charged dangling bond on each nitrogen atom. Stage (b) depicts the adsorption of hydroxide ions. Stage (c) shows the formation of oxides. Stage (d) depicts dissolving of the oxides.

The hydroxide ions ($OH^-$) are first adsorbed on the sample surface and subsequently react with Ga atoms following the reaction:

$$2GaN + 3H_2O \xrightarrow{KOH} Ga_2O_3 + 2NH_3$$

KOH works as a catalyst and is also a solvent for the resulting $Ga_2O_3$ (Step (d)). As the stages of (a) to (d) in FIG. 8 repeat, the N-polar GaN can be etched. Note that it does not matter which atoms form the surface termination layer. If the surface is Ga-terminated, the etching can be initialized by Stage (c). In contrast, the inertness of Ga-polar GaN is ascribed to the repulsion between ($OH^-$) and three occupied dangling bonds of nitrogen, which prevent the hydroxide ions from attacking the Ga atoms, so that the Ga-polar GaN films are not etched.

However, the large lattice mismatch between the epitaxy layer and substrate results in a high dislocation density in GaN, typically in the range of $10^7$-$10^{11}$ $cm^2$. Such defects have a pronounced effect on the etching rate and the resulting surface morphology.

Figure 9:
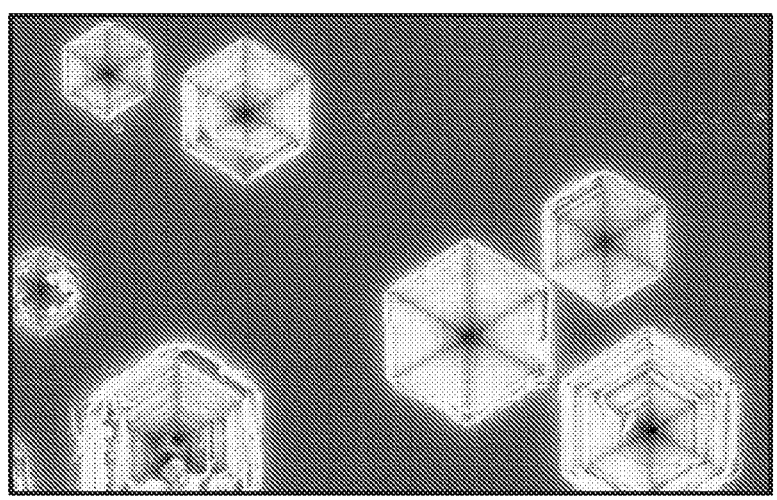
FIG. 9 depicts hexagonal-shaped etch pits due to the selective attack of the etchant on the dislocation defects spots.

FIG. 9 depicts hexagonal-shaped etch pits due to the selective attack of the etchant on the dislocation defects spots. As noted by Seok-In Na et al., "Selective Wet Etching of p-GaN for Efficient GaN-Based Light-Emitting Diodes", IEEE Photonics Technology Letters, Vol. 18, No. 14, Jul. 15, 2006, not only can the dislocation-related selective etch happen in the base etchant, defects introduced by plasma dry etch can also initiate the same kind of selective etch, as shown.

Figure 10A:
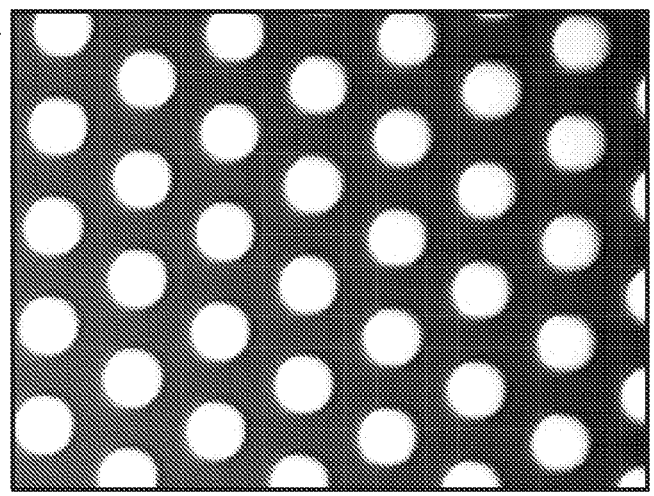
FIGS. 10A through 10C depict selective GaN etches with defects introduced by a plasma dry etch in TMAH etchant.
Figure 10B:
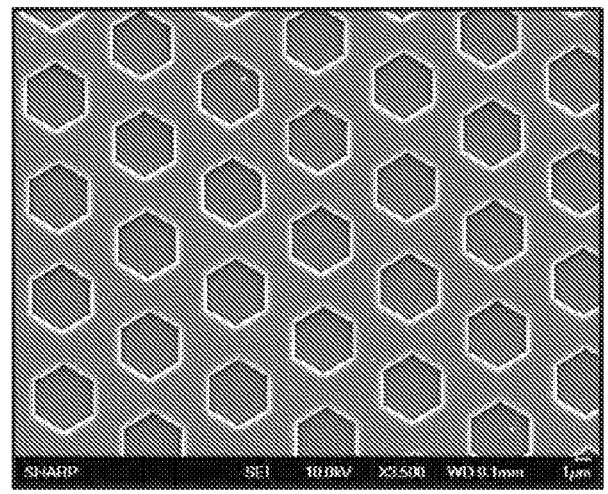
Figure 10C:
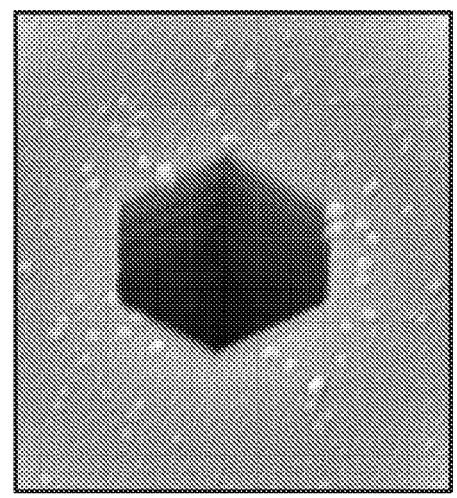

FIGS. 10A through 10C depict selective GaN etches with defects introduced by a plasma dry etch in TMAH etchant. FIG. 10A shows the GaN surface after a 1-minute plasma etch. FIG. 10B shows the same surface after a TMAH wet etch. FIG. 10C is a close-up view of a hexagonal pit. Thus, the etching is done in two steps: first a circular cavity is plasma dry etched into the (0001) planes (FIG. 10A), then crystallographic etch delineates the slow etch rate planes (FIG. 10B). In this case, the plane families ($10\bar{1}0$) are perpendicular to the c-plane in which the hexagonal pits are formed. The ($10\bar{1}0$) plane families can not only form the inner sidewalls of hexagonal pits, they can also be the sidewall of triangle shape GaN micro posts outer sidewall, as shown in FIG. 11.

Figure 11:
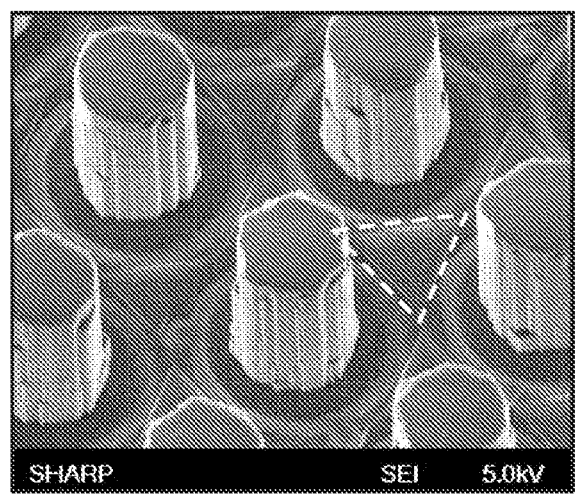
FIG. 11 depicts triangle-shaped GaN micro posts, which are a byproduct of a circular micro post etch.

FIG. 11 depicts triangle-shaped GaN micro posts, which are a byproduct of a circular micro post etch. Clearly, the complementary mask for dry etching micro posts in FIG. 11, followed by the TMAH crystallographic etch, yields full height triangle-shaped GaN micro posts or pillars. There are many advantages to fabricating triangle-shaped GaN micro posts, as discussed below. It should be understood that the introduction of the initial defects need not be limited to a plasma dry etch. The laser ablation of GaN followed by crystallographic etch in TMAH results in similar result. Other techniques used to generate damage regions in a regular pattern such as ion implantation may also work.

For controlled defects generation by laser ablation, the planar GaN film is subjected to pulsed excimer laser irradiation in order to induce thermal decomposition of the GaN into metallic gallium and nitrogen. The noncoherent nature of the excimer laser permits the irradiation of multiple regions simultaneously, although coherent light sources may also be used with diffractive optics.

One pattern consists of a hexagonal array of dots that effectively drills holes into the GaN film to a predetermined penetration depth. This depth is controllable by the number of pulses that are allowed to impinge on a given area and by the energy density of the laser pulse. This laser drilling induces defects in the sidewalls of the affected region which can be subsequently etched anisotropically with a wet etch such as heated dilute TMAH (tetramethyl ammonium hydroxide). This anisotropic etch removes the defective material and effectively stops on the c-plane and m-planes in the film, resulting in a hexagonal etch pit that extends from the GaN film surface to the laser penetration depth. By manipulating the angular orientation of the hexagonal dot array that is used for irradiating the surface with the crystallographic orientation of the GaN film, a predetermined pattern can be formed in the final laser-drilled and wet-etched GaN. For example, if the laser array is aligned to the m-plane orientation, the laser-drilled pits can be etched to end up with a honeycomb structure, as the slowest-etched facets are perpendicular to the nearest neighbor pit. Conversely, when the laser array is aligned to the a-plane orientation (i.e., rotated from the first orientation by (30°), the corners of the etched hexagonal pits impinge upon those from their nearest neighbors, and triangular structures can form if the wet etch process proceeds for a sufficient amount of time.

Figure 12A:
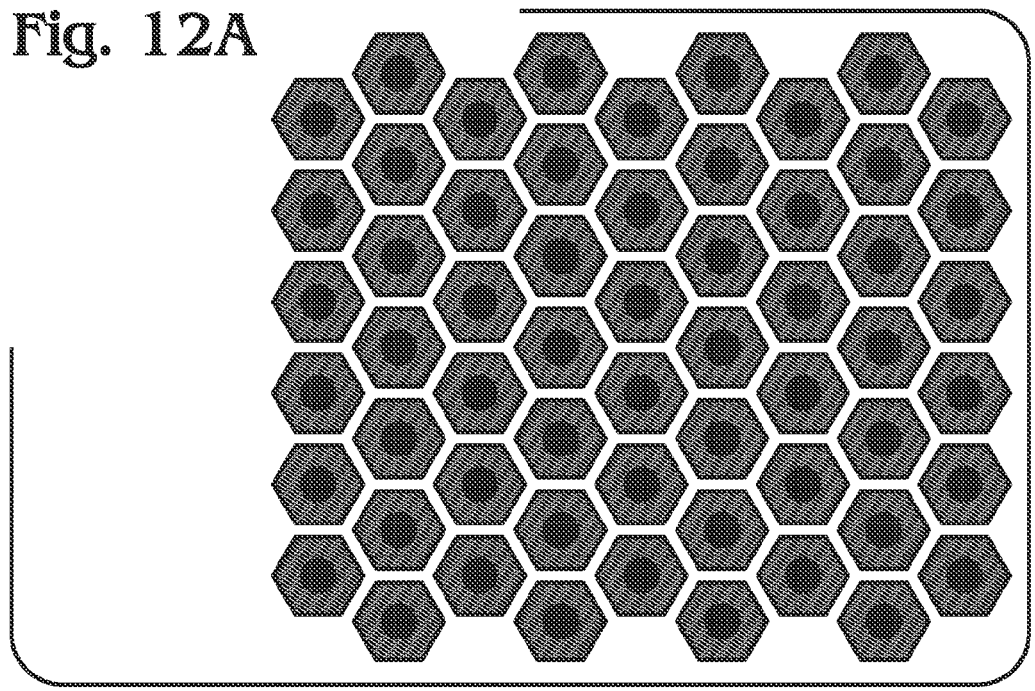
FIGS. 12A and 12B depict possible etch configurations for the combined laser drilling plus anisotropic wet etch process.
Figure 12B:
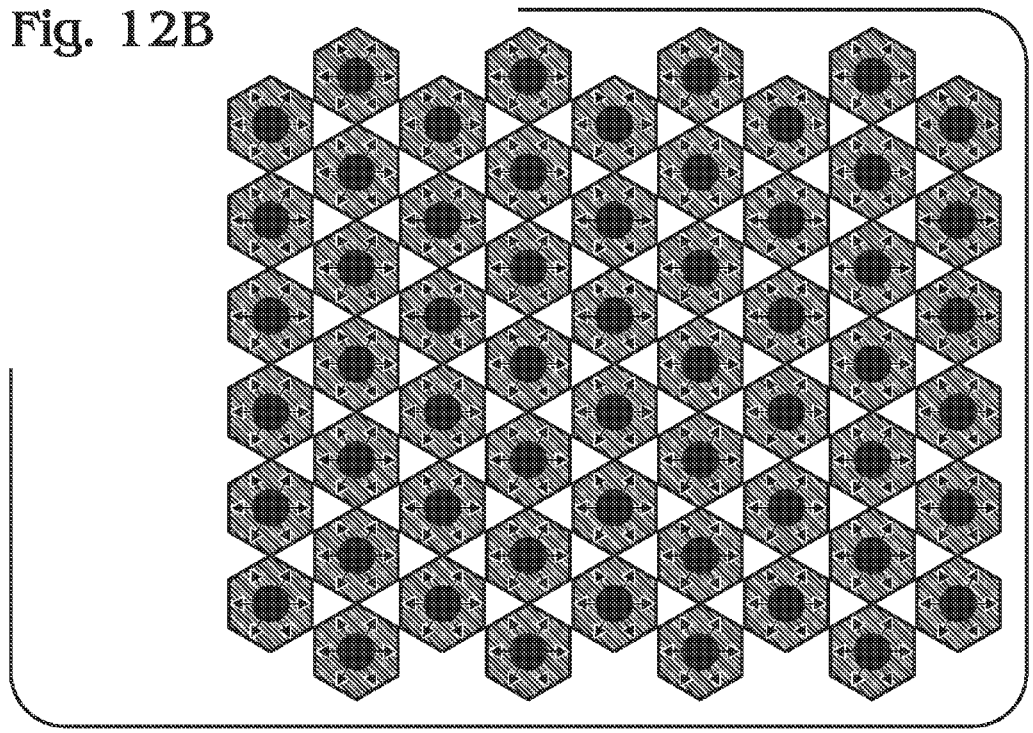

FIGS. 12A and 12B depict possible etch configurations for the combined laser drilling plus anisotropic wet etch process. The laser pattern in FIG. 12A is aligned to the m-plane GaN orientations, while the laser pattern in FIG. 12B is aligned to the a-plane GaN orientation. The black areas represent the initial laser drilling hole, while the gray areas represent the GaN removed by the anisotropic wet etch.

The first of the two configurations (FIG. 12A) results in a well-ordered array of etched pits that have only the c-planes and m-planes exposed. This increase in surface area can be exploited for planar LED applications, allowing epitaxial growth of GaInN and p-GaN over the best-suited crystallographic planes. Due to the nature of the laser process, the depth and sidewall slope of the etched pits can be precisely controlled by the laser fluence and shot count. A typical example for forming etch pits in the GaN would involve 100 shots per area with a 308 nm laser fluence of 1.7 J/cm$^2$. This is then etched in a piranha bath ($H_2O_2$ and $H_2SO_4$ at 140° C. for 20 minutes) to remove the ejected Ga metal, and then etched for 4 to 120 hours in 75° C. TMAH (5%).

The second of the two configurations (FIG. 12B) is well-suited for forming etched vertical μ-rods. Carrying out the anisotropic etch until the corners of the hexagonal pits impinge upon one another allows the bulk of the GaN material to be removed, leaving only triangular vertical pillars. The anisotropic etch leaves behind the m-planes (the family of ($\bar{1}$100) planes in the wurtzite structure, unless they are the a-planes, which are (1$\bar{1}$20) families), yielding a triangular pillar with all faces in the same family of planes. The m-planes are non-polar, making them more favorable for LED device applications.

Experiments show that there is a sharp threshold fluence at approximately 1,100 mJ/cm$^2$ for the laser process to induce thermal decomposition of the GaN films, that is independent of the number of pulses irradiated onto a specific area. The uniformity of laser-induced damage at or close to this threshold is poor due to the stochastic nature of the thermal decomposition and variations in the spatial profile of the laser pulse. However, at higher fluences where thermal decomposition is more readily and uniformly achieved, the number of laser pulses can be seen to have a secondary effect on the sidewall profile and depth of the damaged region in the GaN film. This is particularly noteworthy where a lower shot count (i.e., 30 shots per area) results in shallower etch depth with a more pronounced tapering in towards the center of the etched pit. At higher shot counts per area, the sidewall profile is steeper, and there is less tapering in towards the center with increasing penetration. This is a result of the more numerous laser pulses being responsible for ejecting the molten metallic gallium away from the drilled hole, thereby allowing the thermal decomposition of material at the bottom of the laser-drilled hole to extend laterally from the center.

Experiments were also conducted to observe the effect of anisotropic etching in 5% TMAH at 85° C. for 138 hours following damage inducement by laser drilling. The laser drilling causes extensive damage to the GaN film through the thermal decomposition of the GaN, as well as by the appearance of steep thermal gradients in the localized region surrounding the laser-drilled holes. This damaged material is anisotropically etched by the heated dilute TMAH, which readily attacks the damaged GaN, but is slowed by certain crystallographic places, such as the c-planes and m-planes. This ability to control the profile of the damaged region relative to the crystallographic layout of the GaN film, either by dry etching or by laser drilling, permits control over the final shape of the 3D template being produced.

The laser drilling process is an effective means of inducing damage in the GaN film, especially with a projection-based, excimer-laser-based processing tool. The projection system coupled with a high-power excimer laser allows for a large region to be exposed simultaneously with a uniform fluence that is sufficient to cause thermal decomposition of the GaN. This type of system also has a wide depth of field, typically greater than 25 μm, which eliminates the problems encountered with substrate bowing due to the CTE mismatch during growth of the GaN. The bowing of the substrates is approximately 7-10 μm, which is difficult to overcome with photolithography as used for dry etching of the GaN to form the etched pits prior to etching in TMAH. Excimer lasers are pulsed laser systems that can operate at relatively high frequencies (typically 300 Hz, although some laser systems can go up to 4 kHz), allowing high throughput processing of GaN on sapphire substrates.

Figure 13A:
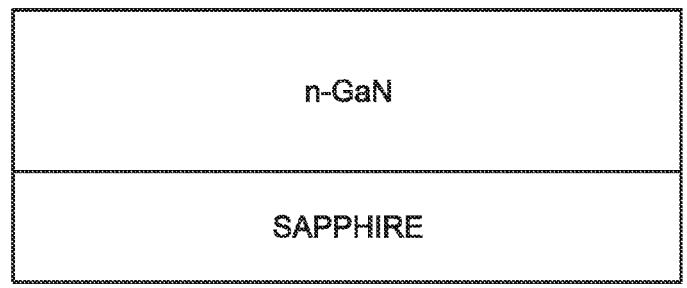
FIGS. 13A through 13G depict steps in an exemplary process fabricating a planar honeycomb LED structure enhanced by three dimensional texturing.
Figure 13B:
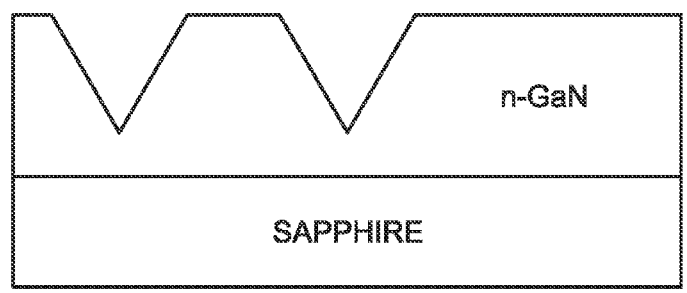
Figure 13C:
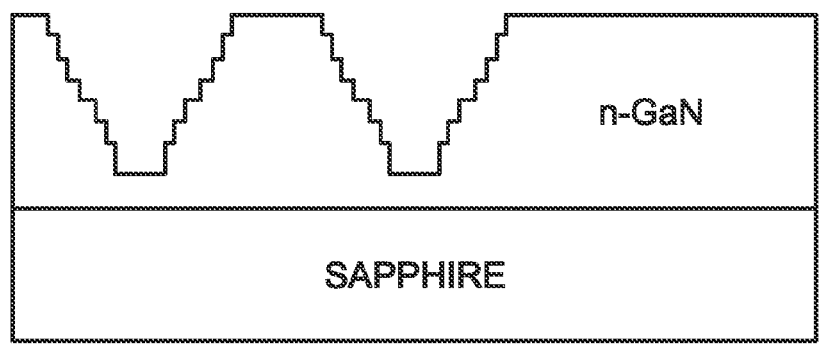
Figure 13D:
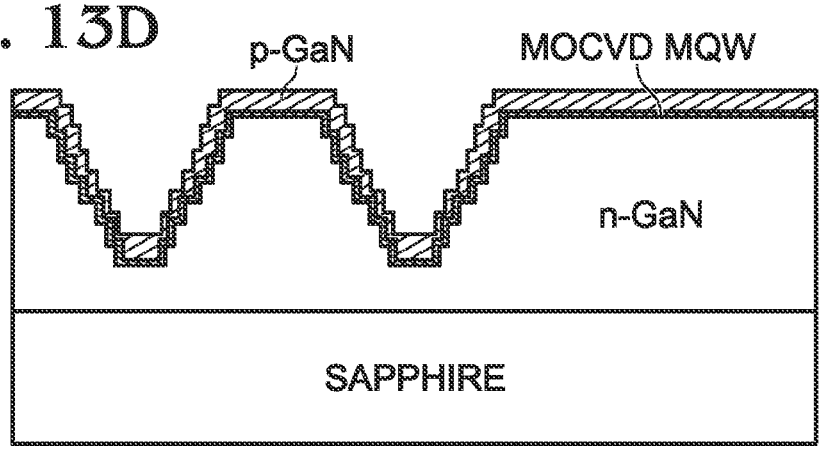
Figure 13E:
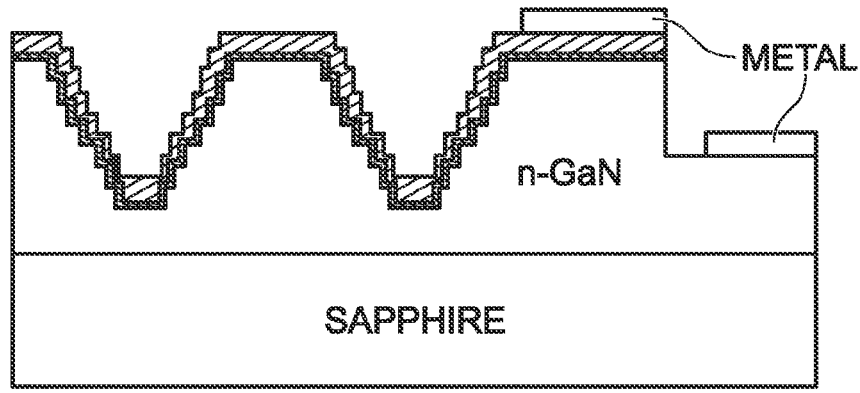
Figure 13F:
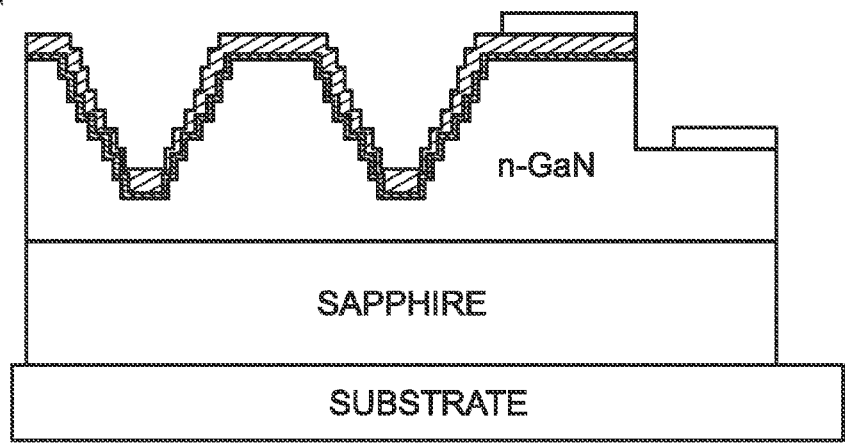
Figure 13G:
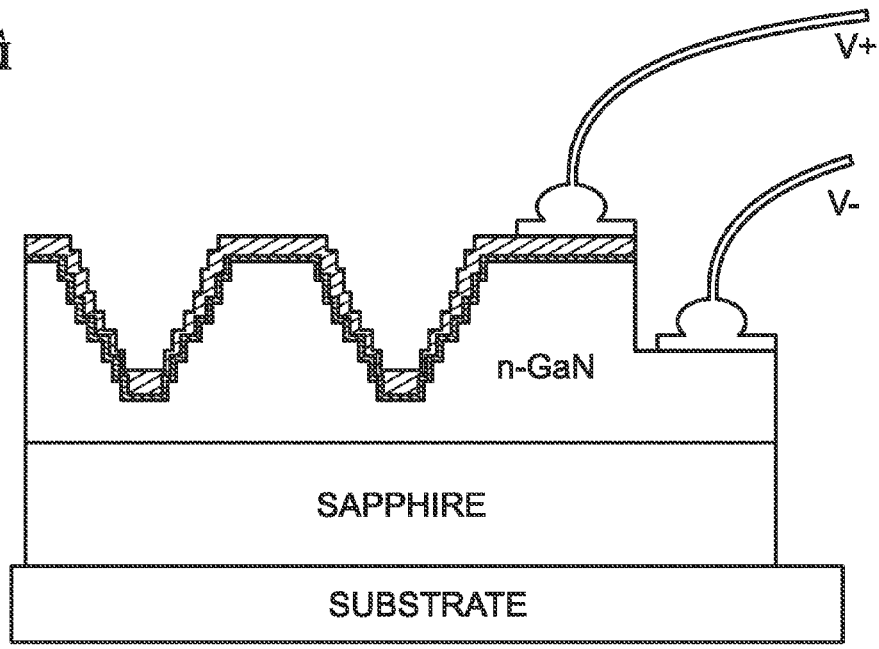

FIGS. 13A through 13G depict steps in an exemplary process fabricating a planar honeycomb LED structure enhanced by three dimensional texturing. FIG. 13A begins with a sapphire substrate and grows a thick n-GaN layer using a MOCVD or MBE process. In FIG. 13B, deep cone-shaped pits are etched or ablated in the n-GaN. In FIG. 13C a wet etch is used, as described above, to remove the damaged GaN. In FIG. 13D a thin n-GaN layer may optionally deposited. Then, the MQW and p-GAN layers are deposited to form an LED on the n-GaN template. In FIG. 13E an opening is etched to contact then-GaN. A metal is deposited on p-GaN and n-GaN contacts using appropriate metal appropriate to prevent a Schottky barrier. In FIG. 13F the sapphire wafer is sawed to singulate devices and an array of devices is attached to a substrate. In FIG. 13G connections are made to the LED with wire bonding.

Figure 14A:
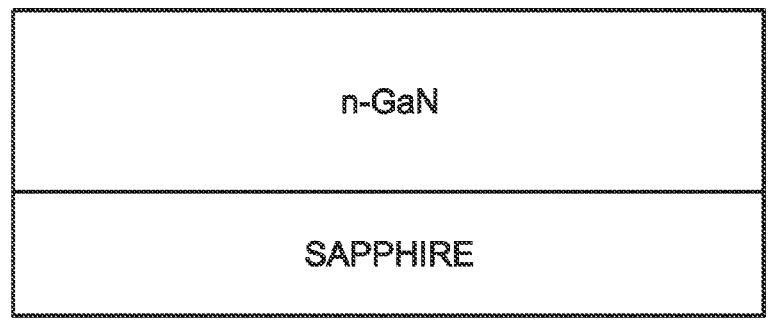
FIGS. 14A through 14G depict steps in an exemplary process for fabricating a micro-rod or pillar LED device.
Figure 14B:
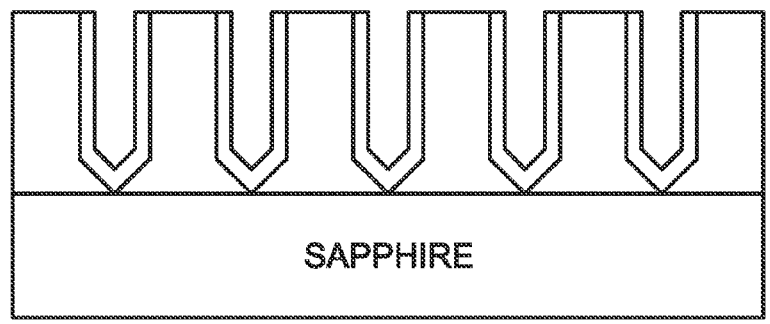
Figure 14C:
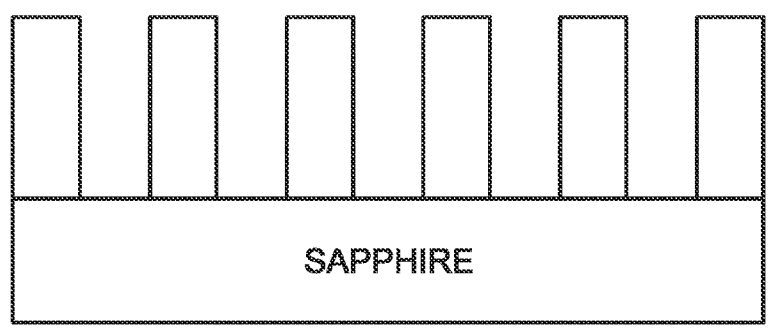
Figure 14D:
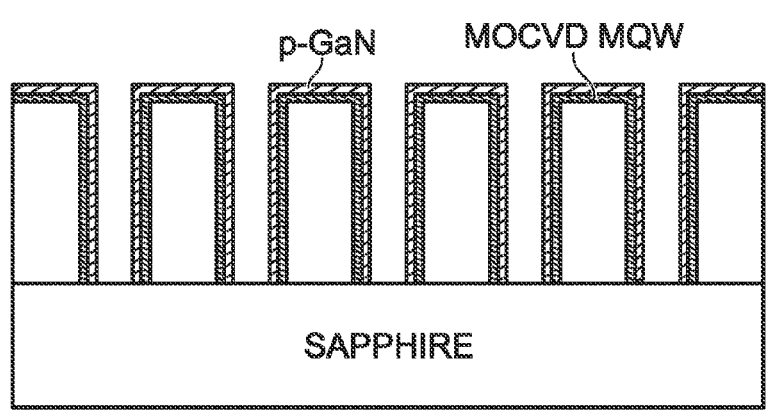
Figure 14E:
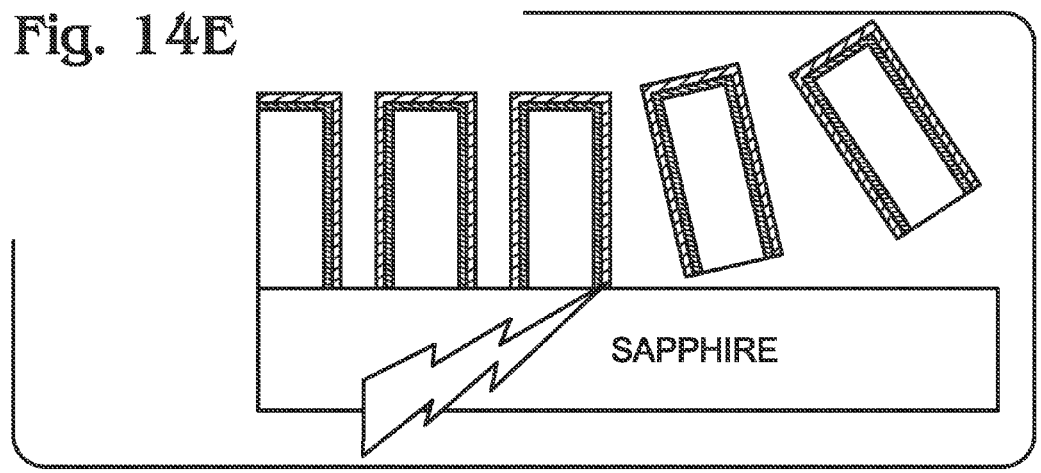
Figure 14F:
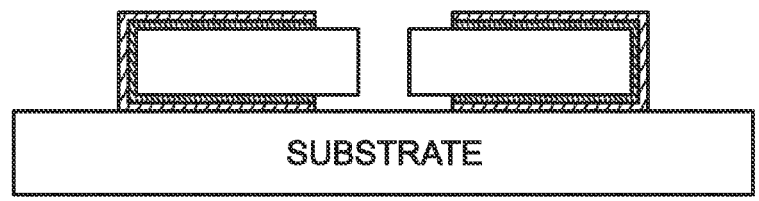
Figure 14G:
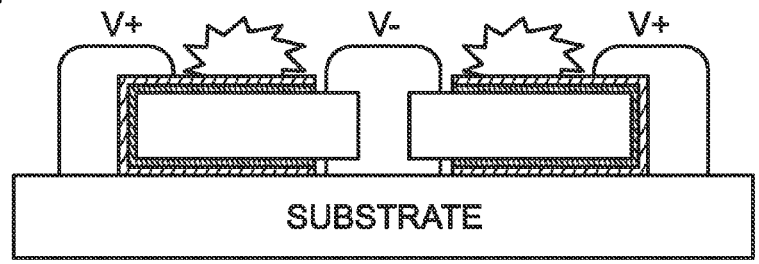

FIGS. 14A through 14G depict steps in an exemplary process for fabricating a micro-rod or pillar LED device. FIG. 14A begins with a sapphire substrate and an n-GaN layer is grown by MOCVD or MBE, typically 10 to 30 microns (μm) thick. In FIG. 14B the n-GaN is etched or ablated to form either triangular or hexagonal pillars. In FIG. 14C a wet etch is used, as described above, to remove the damaged GaN forming vertical pillars. In FIG. 14D a thin n-GaN layer is optionally formed. MQW and p-GAN layers are deposited to form an LED on the n-GaN template. In FIG. 14E the micro-rods are harvested from the sapphire wafer using laser lift-off. In FIG. 14F the micro-rods are deposited on an appropriate substrate. One end of the microrod is etched to contact the n-GaN core. In FIG. 14G metal interconnects are deposited to connect the micro-rod LEDs into arrays.

In summary, the above-described fabrication processes are a combination of damage-inducing etch of GaN films, with an anisotropic crystallographic wet etch, to produce predetermined 3D structures. Using these methods, etch pits in GaN can form an array of hexagonal tapered pits bounded by the crystallographic m and c planes. Triangular, vertical GaN g-rods with m-family {1$\bar{1}$00} sidewalls can be made that are ideal (i.e., non-polar) templates for LED applications. Hexagonal, vertical GaN g-rods with a-family {11$\bar{2}$0} sidewalls can be made that are ideal (i.e., non-polar) templates for LED applications.

Figure 16A:
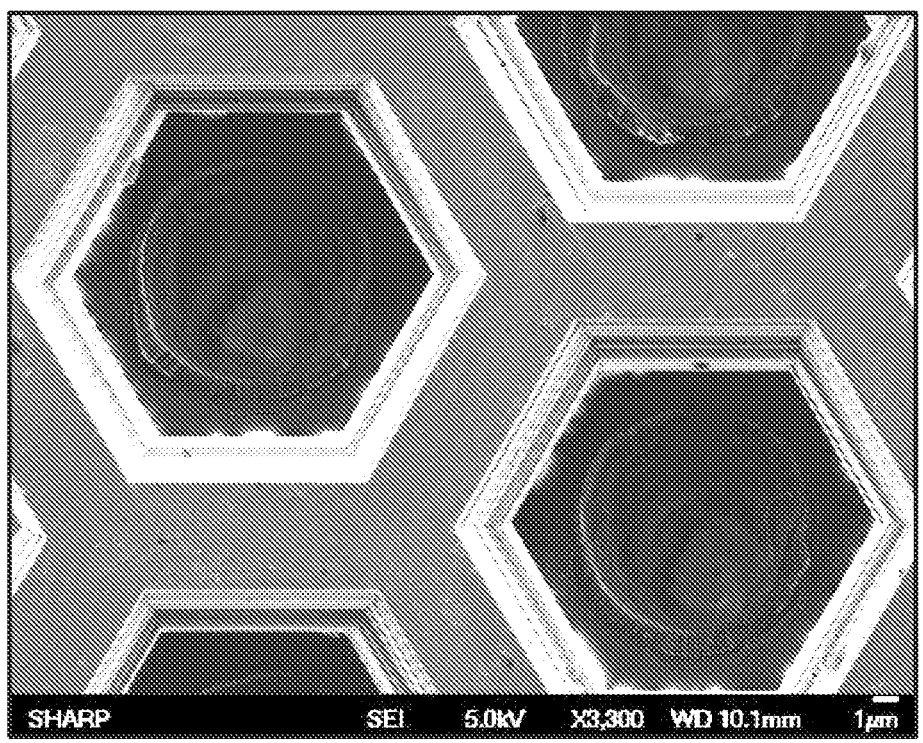
FIGS. 16A and 16B are scanning electron microscope (SEM) image representations of, respectively, a honeycomb structure and triangular etched pillars.
Figure 16B:
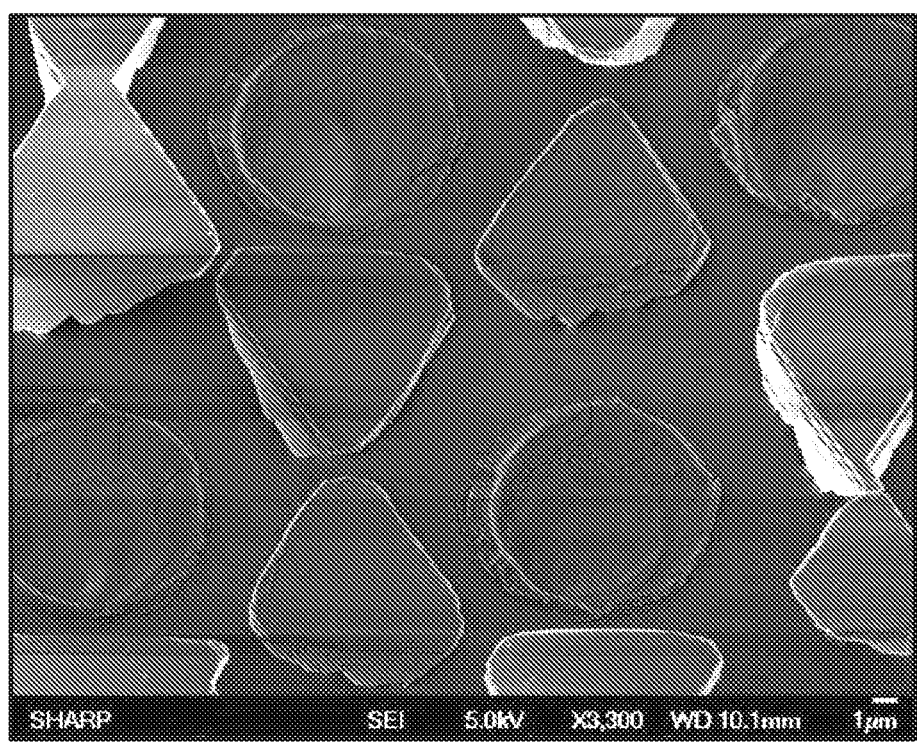

FIGS. 16A and 16B are scanning electron microscope (SEM) image representations of, respectively, a honeycomb structure and triangular etched pillars. Both samples were processed with 120 laser shots per area at 1.6 J/cm$^2$. The substrate flat orientation is typically aligned to either a-axis or m-axis. A 30° offset (e.g., m-axis flat orientation and no compensation in rotation for laser process) can lead to formation of a honeycomb structure, instead of triangular μ-rods.

By etching hexagonal arrays of laser drilled holes with heated 5% TMAH, triangular μ-rods with controlled crystallographic faces are formed. The laser process has a much wider depth of field than lithographic processes, bypassing the issues associated with wafer bowing from thermal stress. The anisotropic TMAH etch is selective to the c-plane, as well as to the m-planes. This permits the formation of triangles with the c-plane (0001) at the end, and m-planes (1100) on all three vertical sides.

A similar structure is possible through conventional VLS growth of GaN nanowires (Nano Let., v. 6, n. 8, 2006, p. 1808), with the sides aligned to the family of m-axes, and the top aligned to the c-axis. However, these are reported to be hexagonal in shape and require very high temperature MOCVD processes (1050° C.) for the growth. The hexagonal structure can cause reentrant regions that make some aspects of LED fabrication more difficult.

FIG. 15 is a flowchart illustrating a method for fabricating three-dimensional GaN pillar structures with planar surfaces. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1500.

Step 1502 provides a substrate. The substrate may be sapphire, silicon carbide, or silicon substrates. Step 1504 grows a GaN film overlying a top surface of the substrate. Step 1506 forms cavities in a top surface of the GaN film. The cavities may be formed using a laser ablation, ion implantation, sand blasting, or dry etching process. Step 1508 wet etches the cavities in the GaN film top surface. Step 1510 forms planar sidewalls extending into the GaN film. If Step 1510 forms GaN pillars, Step 1512 detaches the GaN pillars from the substrate.

In one aspect, forming cavities in the top surface of the GaN film (Step 1506) includes forming the cavities into a c-plane top surface. Forming planar sidewalls extending into the GaN film in Step 1510 includes forming sidewalls perpendicular to the c-plane, from the m-plane or a-plane family. Alternatively expressed, Step 1506 forms an array of cavities extending in a direction aligned with a c-plane zone axis in the GaN film, and Step 1510 forms a plurality of GaN pillars with sidewall surfaces in the m-plane or a-plane family.

In another aspect, wet etching the cavities in the GaN film top surface in Step 1508 includes the following substeps. Step 1508a removes GaN material damaged in response to forming the cavities (in Step 1506). Step 1508b stops removing the GaN material in response to encountering c-planes, m-planes, and a-planes in the GaN film.

In one variation Step 1510 forms a plurality of triangular GaN pillars with sidewall surfaces in the m-plane or a-plane family. In this variation, prior to forming the cavities in the top surface of the GaN film, Step 1505 forms a mask comprising an array of circular holes exposing the top surface of the GaN film. Then Step 1506 dry etches cavities in regions of the GaN top surface exposed by the mask. Wet etching the cavities in the GaN film in Step 1508 includes anisotropically extending the cavity in all directions into the GaN film. Forming the triangular GaN pillars with planar sidewalls in Step 1510 includes the following substeps. In Step 1510a the wet etch process slows when encountering a first plane that is either from the m-plane or a-plane family. Step 1510c forms substantially triangular GaN pillars, each from a plurality of connected sidewalls in the first plane. The shape is substantially triangular, with the exact shape responsive to etch control parameters, the mask pattern, and substrate orientation. In one aspect Step 1505 forms a mask with a hexagonal array of holes.

In a different aspect, prior to forming the cavities in the top surface of the GaN film, Step 1505 forms a mask comprising an array of holes exposing the top surface of the GaN film. Then, Step 1506 dry etches cavities in regions of the GaN top surface exposed by the mask. Wet etching the cavities in the GaN film in Step 1508 includes anisotropically extending the cavity in all directions into the GaN film. Forming the GaN pillars with planar sidewalls includes the following substeps. In Step 1510a the wet etch process slows when encountering a first plane that is either in the m-plane or a-plane family. Step 1510b forms substantially circular GaN pillars, each from a plurality of connected sidewalls in the first plane. The shape is substantially circular, with the exact shape responsive to etch control parameters affecting and the mask pattern. In one aspect Step 1510 forms a mask with a hexagonal array of holes.

The hexagonal pillars are formed by using a reverse tone mask (i.e., reverse relative to the mask used to form the cavities) for patterning with the dry etch process. This mask, formed as a part of Step 1505, is used to pattern the GaN top surface, which is then followed by a dry etch to produce the substantially circular pillars, as shown in FIG. 7. Wet etching the cavities in Step 1508 includes anisotropically etching the pillars in all directions into the GaN film. Forming the GaN pillars with planar sidewalls includes the following substep. In Step 1510*a* the wet etch process slows when encountering a first plane that is either in the m-plane or a-plane family. This hexagonal pillar formation is unaffected by the rotation of the mask relative to the GaN orientation, and also holds true regardless of the position or spacing of the etched pillars relative to their nearest neighbors.

As noted above, forming planar sidewalls extending into the GaN film (Step 1510) may include selecting the GaN sidewall plane family in response to the wet etch chemistry. For example, Step 1508 may anisotropically etch the cavities with TMAH (tetramethylammonium hydroxide) at a concentration of 5%, at a temperature in a range between 60-80° C. Then, selecting the GaN sidewall plane family in response to the wet etch chemistry includes the anisotropic etch stopping at either m-planes or c-planes.

In another aspect, forming the cavities in the top surface of the GaN film in Step 1506 includes laser ablating an array of cavities into the GaN top surface. Step 1508 anisotropically extends the cavity in all directions into the GaN film. Then, forming the GaN pillars with planar sidewalls in Step 1510 includes the following substeps. In Step 1510*a* the wet etch process slows when encountering a first plane selected from the m-plane and a-plane family. Step 1510*b* forms substantially circular GaN pillars, each from a plurality of connected sidewalls in the first plane. If Step 1506 laser ablates a hexagonal array of cavities, Step 1510 forms hexagonal GaN pillars. Alternatively, Step 1510*c* forms substantially triangular GaN pillars, each from a plurality of connected sidewalls in the first plane. In one aspect Step 1506 laser ablates a hexagonal array of cavities in the top surface of the GaN film. The difference between forming pillars and the honeycomb structure is dependent upon the rotation in the crystallographic planes relative to the induced hexagonal etch pattern in Step 1506.

In a different aspect, forming planar sidewalls extending into the GaN film includes the substep (Step 1510*d*) of forming hexagonally shaped openings in the GaN film, which result is a GaN honeycomb structure.

A method has been provided for forming GaN 3D structures and associated GaN 3D structure arrays. Examples of particular process steps have been presented to illustrate the invention. However, the invention is not limited to merely these examples. Other variations and embodiments of the invention will occur to those skilled in the art.

We claim:

1. A method for fabricating three-dimensional gallium nitride (GaN) pillar structures with planar surfaces, the method comprising:
providing a substrate;
growing a GaN film overlying a top surface of the substrate;
forming cavities in a top surface of the GaN film;
wet etching the cavities in the GaN film top surface as follows:
removing GaN material damaged in response to forming the cavities; and,
stopping the removal of GaN material in response to encountering c-planes, m-planes, and a-planes in the GaN film; and,
forming planar sidewalls extending into the GaN film.

2. The method of claim 1 wherein forming cavities in the top surface of the GaN film includes forming cavities using a process selected from a group consisting of laser ablation, ion implantation, sand blasting, and dry etching.

3. The method of claim 1 wherein forming cavities in the top surface of the GaN film includes forming the cavities into a c-plane top surface; and,
wherein forming planar sidewalls extending into the GaN film includes forming sidewalls perpendicular to a c-plane selected from a group consisting of the m-plane and a-plane family.

4. The method of claim 3 wherein forming planar sidewalls extending into the GaN film includes selecting a GaN sidewall plane family in response to a wet etch chemistry.

5. The method of claim 4 wherein wet etching the cavities in the GaN film top surface includes anisotropically etching the cavities with TMAH (tetramethylammonium hydroxide) at a concentration of 5%, at a temperature in a range between 60-80° C.; and,
wherein selecting the GaN sidewall plane family in response to the said wet etch chemistry includes the said anisotropic etch stopping at a plane selected from a group consisting of m-planes and c-planes.

6. The method of claim 3 wherein forming planar sidewalls extending into the GaN film includes forming hexagonally shaped openings in the GaN film.

7. The method of claim 6 wherein forming hexagonal shaped openings in the GaN film includes forming a GaN honeycomb structure.

8. The method of claim 1 wherein forming the cavities in the top surface of the GaN film includes forming an array of cavities extending in a direction aligned with a c-plane zone axis in the GaN film; and,
wherein forming planar sidewall extending into the GaN film includes forming a plurality of GaN pillars with sidewall surfaces in a plane selected from the m-plane and a-plane family.

9. The method of claim 8 further comprising:
prior to forming the cavities in the top surface of the GaN film, forming a mask comprising an array of holes exposing the top surface of the GaN film;
wherein forming the cavities in the top surface of the GaN film includes dry etching cavities in regions of the GaN top surface exposed by the mask;
wherein said wet etching the cavities in the GaN film includes anisotropically extending the cavities in all directions into the GaN film;
wherein forming planar sidewalls extending into the GaN film includes:
the said wet etch process slowing when encountering a first plane selected from the m-plane and a-plane family; and,
forming GaN pillars having a shape selected from a group consisting of triangular and hexagonal, each from a plurality of connected sidewalls in the first plane.

10. The method of claim 9 wherein forming the mask includes forming a mask with a hexagonal array of holes.

11. The method of claim 8 wherein forming the cavities in the top surface of the GaN film includes laser ablating an array of cavities into the GaN top surface;
wherein said wet etching the cavities in the GaN film includes anisotropically extending the cavities in all directions into the GaN film;
wherein forming the GaN pillars with planar sidewalls includes:
the said wet etch process slowing when encountering a first plane selected from the m-plane and a-plane family; and, forming GaN pillars with a shape selected from a group consisting of triangular and hexagonal, each from a plurality of connected sidewalls in the first plane.

12. The method of claim 11 wherein laser ablating the array of cavities includes laser ablating a hexagonal array of cavities.

13. The method of claim 1 wherein providing the substrate includes providing a substrate selected from a group consisting of sapphire, silicon carbide, and silicon substrates.

14. The method of claim 1 wherein forming planar sidewalls extending into the GaN film includes forming GaN pillars; and, the method further comprising:

detaching the GaN pillars from the substrate.

15. A method for fabricating three-dimensional gallium nitride (GaN) pillar structures with planar surfaces, the method comprising:

providing a substrate;

growing a GaN film overlying a top surface of the substrate;

forming a mask comprising an array of holes exposing the top surface of the GaN film;

dry etching the GaN top surface exposed by the mask to form an array of cavities extending in a direction aligned with a c-plane zone axis in the GaN film;

wet etching the cavities in the GaN film top surface to anisotropically extend the cavities in all directions into the GaN film; and, forming a plurality of GaN pillars with sidewall surfaces in a plane selected from the m-plane and a-plane family, as follows:

the said wet etch process slowing when encountering a first plane selected from the m-plane and a-plane family; and, forming GaN pillars having a shape selected from a group consisting of triangular and hexagonal, each from a plurality of connected sidewalls in the first plane.

16. The method of claim 15 wherein forming the mask includes forming a mask with a hexagonal array of holes.

17. A method for fabricating three-dimensional gallium nitride (GaN) pillar structures with planar surfaces, the method comprising:

providing a substrate;

growing a GaN film overlying a top surface of the substrate;

forming cavities in a c-plane top surface of the GaN film;

wet etching the cavities in the GaN film top surface; and, forming planar sidewalls extending into the GaN film perpendicular to the c-plane, and selected from a group consisting of the m-plane and a-plane family, in response to a wet etch chemistry.

18. The method of claim 17 wherein wet etching the cavities in the GaN film top surface includes anisotropically etching the cavities with TMAH (tetramethylammonium hydroxide) at a concentration of 5%, at a temperature in a range between 60-80° C.; and, wherein selecting a GaN sidewall plane family in response to the said wet etch chemistry includes the anisotropic etch stopping at a plane selected from a group consisting of m-planes and c-planes.

19. A method for fabricating three-dimensional gallium nitride (GaN) pillar structures with planar surfaces, the method comprising:

providing a substrate;

growing a GaN film overlying a top surface of the substrate;

laser ablating the GaN top surface to form an array of cavities extending in a direction aligned with a c-plane zone axis in the GaN film;

wet etching the cavities in the GaN film top surface, to anisotropically extend the cavities in all directions into the GaN film; and, forming a plurality of GaN pillars with sidewall surfaces in a plane selected from the m-plane and a-plane family, as follows:

the said wet etch process slowing when encountering a first plane selected from the m-plane and a-plane family; and, forming GaN pillars with a shape selected from a group consisting of triangular and hexagonal, each from a plurality of connected sidewalls in the first plane.

20. The method of claim 19 wherein laser ablating the array of cavities includes laser ablating a hexagonal array of cavities.

* * * * *

UNITED STATES PATENT AND TRADEMARK OFFICE
CERTIFICATE OF CORRECTION

PATENT NO. : 8,685,774 B2  Page 1 of 1
APPLICATION NO. : 13/337843
DATED : April 1, 2014
INVENTOR(S) : Crowder et al.

It is certified that error appears in the above-identified patent and that said Letters Patent is hereby corrected as shown below:

In the Specification

Column 3, line 67, delete the term " $\{0\bar{1}10\}$ " and insert -- $\{01\bar{1}0\}$ --.

Column 4, line 2, delete the term " $\{2\bar{1}10\}$ " and insert -- $\{\bar{1}110\}$ --.

Signed and Sealed this
Sixteenth Day of December, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,685,774 B2  
APPLICATION NO. : 13/337843  
DATED : April 1, 2014  
INVENTOR(S) : Crowder et al.

Page 1 of 1

It is certified that error appears in the above-identified patent and that said Letters Patent is hereby corrected as shown below:

In the specification:

Column 3, line 67, delete " $\{0\bar{1}110\}$ " insert -- $\{0\bar{1}10\}$ --.

Column 4, line 2, delete " $\{\bar{1}110\}$ " insert -- $\{\bar{2}110\}$ --.

Signed and Sealed this
Sixteenth Day of August, 2016

Michelle K. Lee
*Director of the United States Patent and Trademark Office*